US009060146B2

(12) United States Patent
Troccoli (10) Patent No.: US 9,060,146 B2
(45) Date of Patent: Jun. 16, 2015

(54) LOW NOISE READING ARCHITECTURE FOR ACTIVE SENSOR ARRAYS (75) Inventor: Matias Troccoli, Kirkland, WA (US)

(73) Assignee: Next Biometrics Group ASA, Oslo (NO)

( * ) Notice: Subject to any disclaimer, the term of this patent is extended or adjusted under 35 U.S.C. 154(b) by 682 days.

(21) Appl. No.: 13/143,207

(22) PCT Filed: Jan. 5, 2010

(86) PCT No.: PCT/US2010/020091
§ 371 (c)(1),
(2), (4) Date: Jul. 5, 2011

(87) PCT Pub. No.: WO2010/080751
PCT Pub. Date: Jul. 15, 2010

(65) Prior Publication Data
US 2011/0267033 A1   Nov. 3, 2011

Related U.S. Application Data (60) Provisional application No. 61/142,716, filed on Jan. 6, 2009.

(51) Int. Cl.
*G01R 29/00* (2006.01)
*G06K 9/00* (2006.01)
*H04N 5/3745* (2011.01)

(52) U.S. Cl.
CPC .................. *H04N 5/3745* (2013.01)

(58) Field of Classification Search
CPC ....................................... G06K 9/00
USPC ........................ 324/760.01, 760.02
See application file for complete search history.

(56) References Cited

U.S. PATENT DOCUMENTS

| 5,900,767 | A | 5/1999 | Bird et al. |
| 5,907,627 | A | 5/1999 | Borza |
| 6,091,837 | A | 7/2000 | Dinh |
| 6,108,438 | A | 8/2000 | Bird et al. |
| 6,141,240 | A | 10/2000 | Madan et al. |
| 6,426,547 | B1 * | 7/2002 | Greenberg et al. ........... 257/656 |
| 6,545,500 | B1 | 4/2003 | Field |
| 7,229,860 | B2 | 6/2007 | Song et al. |
| 7,400,067 | B2 * | 7/2008 | Atluri et al. ..................... 307/85 |

(Continued)

FOREIGN PATENT DOCUMENTS

WO   2006033582 A1   3/2006

OTHER PUBLICATIONS

The International Bureau of WIPO, International Preliminary Report on Patentability, Issued Jul. 12, 2011.

(Continued)

*Primary Examiner* — Arleen M Vazquez
*Assistant Examiner* — Feba Pothen
(74) *Attorney, Agent, or Firm* — Duane Morris LLP (57) ABSTRACT A sensor apparatus includes an array of active sensor elements arranged in columns and rows. Each sensor element is associated with a thin film access device disposed in a first current path through which an activation current is provided to activate the sensor element. Each sensor element is read through a respective second current path. The second current paths do not include the thin film access device of the first current path. As such, noise from the thin film access device is isolated from the second current paths.

21 Claims, 9 Drawing Sheets

200A

(56) References Cited

U.S. PATENT DOCUMENTS

| | | |
|---|---|---|
| 7,910,902 B2 * | 3/2011 | Dinh .......................... 250/556 |
| 2005/0264474 A1 | 12/2005 | Rast |
| 2006/0125971 A1 | 6/2006 | Abileah et al. |
| 2006/0158392 A1 * | 7/2006 | Liao et al. ..................... 345/76 |
| 2008/0136338 A1 | 6/2008 | Troccoli et al. |
| 2009/0085904 A1 * | 4/2009 | Virtanen et al. .............. 345/211 |

OTHER PUBLICATIONS

International Search Report issued Mar. 15, 2010 in PCT/US2010/020091.

* cited by examiner

LOW NOISE READING ARCHITECTURE FOR ACTIVE SENSOR ARRAYS

CROSS-REFERENCE TO RELATED APPLICATION

This application claims priority to U.S. Provisional Patent Application No. 61/142,716 filed Jan. 6, 2009, entitled "Low Noise Reading Architecture for Active Sensor Arrays," the entirety of which is hereby incorporated by reference herein.

FIELD OF THE INVENTION

The present invention relates to sensor arrays and more specifically to active sensor arrays.

BACKGROUND OF THE INVENTION

In the field of large area electronics, low cost but high performance sensors are one of the most targeted applications. These sensors can be used for a variety of acquisition functions such as thermal measurements, x-ray detection, and pressure sensing, to name a few. These devices are used in diverse fields including medical, environmental, security and industrial, amongst others. In particular, biometric security has attracted a great deal of attention in the recent years and, at the forefront of this field, fingerprint technology is the dominant technology. The fine patterns formed by ridges and valleys on the finger's skin can be mapped by sensing arrays of high resolution. These sensing arrays have been used for a number of years in this field, but they vary in basic operating principles. Some sensors utilize heat signals, while others electrical or optical signals. Accuracy levels are limited by the physical principles used to read fingerprint patterns (i.e., optical, capacitive, pressure, etc.) and most have not yielded the level of accuracy required for biometric security purposes. Furthermore, immunity to environmental variables such as dirt or humidity is also important when performing a fingerprint scan.

Development and commercialization of these sensing arrays are usually dictated by the cost of the processing technology used to build them as well as their sensing accuracy. Because these sensors are built over a large area, selecting a suitable technology that can yield the appropriate level of accuracy at an acceptable cost is often difficult.

The most efficient and accurate sensing arrays are based on active principles. Active sensors quantify a specific physical parameter response to a given stimulus. One of the most promising methods is the active thermal principle. In particular, active thermal sensors measure an object's heat conductance for a given heating stimulus. Examples of sensors of this type are disclosed in U.S. Pat. No. 6,091,837 to Dinh, entitled "Sensor for Acquiring a Fingerprint Image Based on Heat Transfer" (hereinafter "Dinh I") and WO 2006/033582 A1, also to Dinh, entitled "Apparatus for Fingerprint Sensing and Other Measurements" (hereinafter, "Dinh II"), the entirety of each of which is hereby incorporated by reference herein. The response to the stimulus is measured by each of the sensing sites within a sensor array. The thermal response of an element is in part a function of the stimulus provided, i.e., the larger the stimulus, the larger the response. Sensing sites are heated by application of an electrical current to the site.

Recent advances in lower cost semiconductor electronics, such as high performance polycrystalline silicon ("polysilicon") thin film transistors (TFTs), have enabled the implementation of accurate sensing arrays at a reduced cost. Pairing this device technology with the active thermal principle for fingerprint scanning can provide advantages such as low profile devices, improved ruggedness and accuracy. Use of this technology also provides the ability to integrate control circuitry on the same panel as the sensing array, further reducing cost and increasing integration levels. One of the main drawbacks of using these lower cost technologies, however, is their limited device performance when compared to conventional, single crystalline electronics. Even though material properties have improved dramatically in recent years, improvements are still needed. For example, it is important to acquire an electric signal that is free of electrical noise (i.e., a signal that has good signal-to-noise ratio). This ratio eventually determines the accuracy of the system and ultimately its ability to detect, for example, correct fingerprints. Thin film devices formed using polycrystalline material can generate high amounts of electrical noise, particularly when using a large stimulus (e.g., current) to obtain a high response. This makes the task of obtaining a good signal to noise ratio difficult.

Sensing architectures having improved device performance are desired.

SUMMARY OF THE INVENTION

A sensor apparatus includes an array of active sensor elements arranged in columns and rows. Each sensor element is associated with a thin film access device disposed in a first current path through which an activation current is provided to activate the sensor element. Each sensor element is read through a respective second current path. The second current paths do not include the thin film access device of the first current path. As such, noise from the thin film access device is isolated from the second current paths.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

This description of the exemplary embodiments is intended to be read in connection with the accompanying drawings, which are to be considered part of the entire written description.

Figure 1:
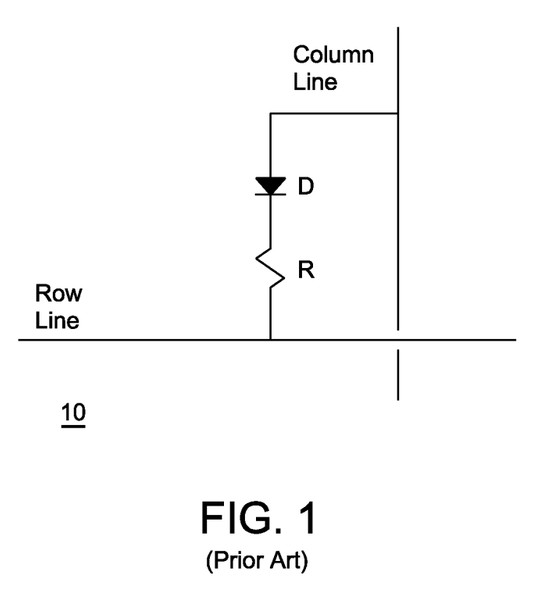
FIG. 1 is a circuit diagram of a prior art active sensing site.
Figure 2:
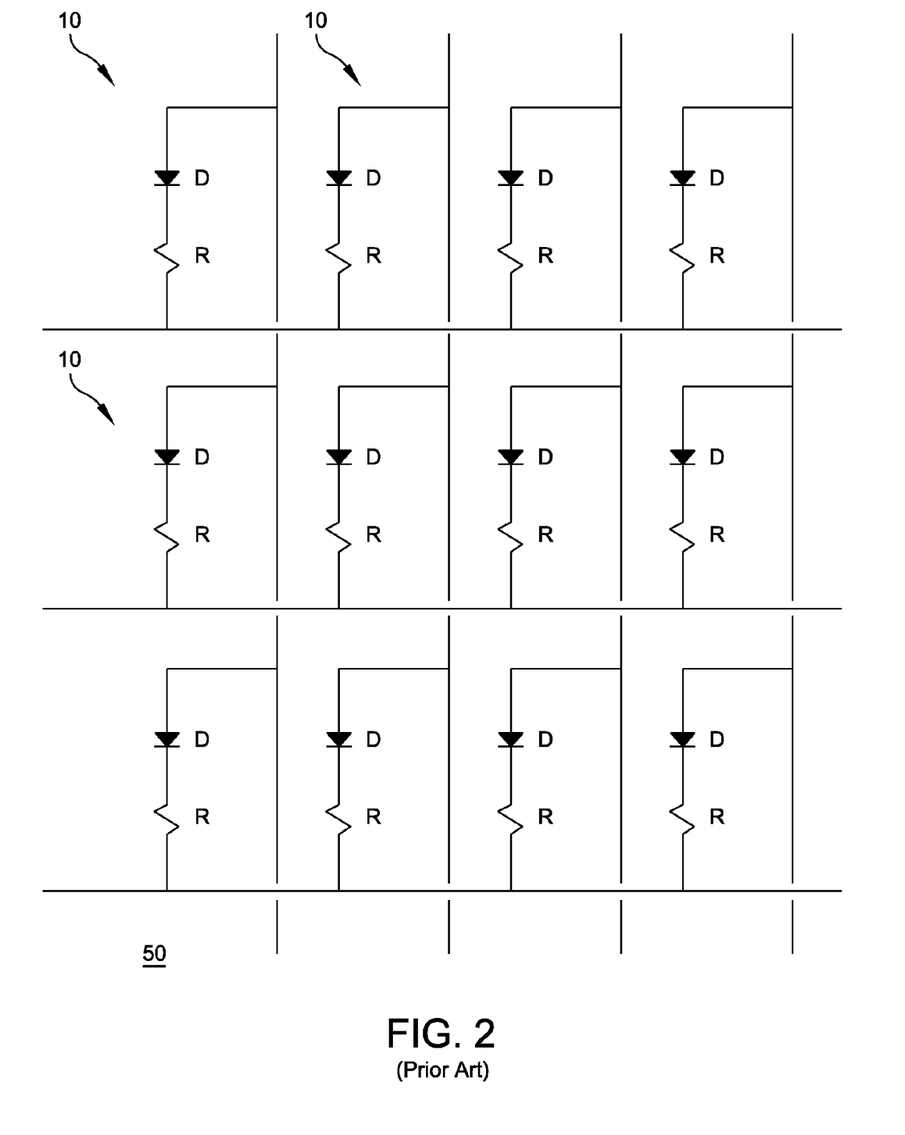
FIG. 2 is a circuit diagram of a prior art array of sensing sites.

In large area sensor arrays, thousands of sensing sites are arranged in rows and columns accessed and controlled by horizontal and vertical conducting traces. It is critical that each site can be accessed independently and information is isolated from other sites. Due to space limitations, it is preferred that all functions be performed by a minimal number of devices. Utilizing active pixels with nonlinear access devices for the sensing sites facilitates this goal. By utilizing a nonlinear access device such as a diode or a diode in combination with a linear device such as a resistor (as shown in the sensor site 10 of FIG. 1), electrical isolation is provided from other sensing sites when connected in an array fashion. The diode D provides the isolation/selection function and the resistor R serves as the thermal heating/sensing element. Sensing sites with two terminals can share one connection horizontally (forming row lines) and one connection vertically (forming the column lines). This is shown in the array 50 of FIG. 2. The vertical conducting trace provides the heating current and each horizontal conducting line is used to electrically ground all row terminals. This allows the heating current to flow through only one sensing site, i.e., that sensing site 10 where the diode D of a site is forward biased (i.e., when its anode connected to the column line is high and its cathode connected to the row line is grounded). The thermal information for a given site 10, measured in form of a differential voltage, can be obtained at each end of the vertical and horizontal conducting traces.

The array of sensing sites can be controlled by external circuitry that sequentially enables each column and each row. This is done by applying the heating current to the vertical conducting traces (column selection) and by grounding the horizontal traces (row selection). External circuitry measures the differential voltage signal at the head of a selected column and at the end of a selected row. This differential signal represents the thermal information for each sensing site. A more detailed view of the array 100 with exemplary selection circuitry is shown in FIG. 3 and described below.

Figure 3:
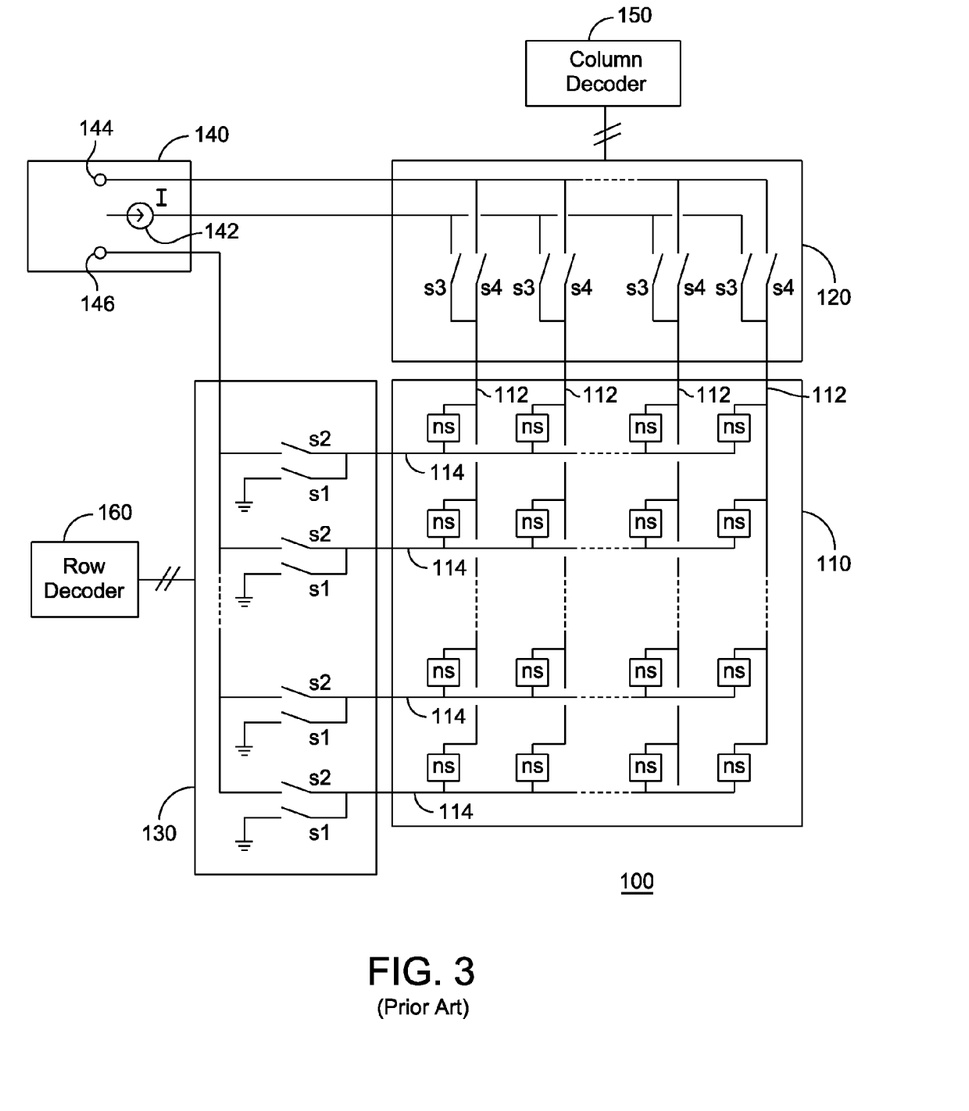
FIG. 3 is a prior art diagram of a sensing apparatus.

FIG. 3 shows a prior art sensing apparatus 100 including a sensor array 110 formed of active sensing pixels "ns" as well as surrounding row and column selection circuits. The sensing pixel can be configured as described above in FIG. 1, each with a resistor R and diode D. Reference 112 identifies column lines or traces and reference 114 identifies row lines or traces. Each sensing site has a column terminal connected to a column line 112 and a row terminal connected to a row line 114. Block 140 provides the stimulus current from a current source 142 for each pixel site in the array 110. The biasing current is directed into the correct columns lines 112 by TFT switches 's3,' which can be multiplexed by a decoder or shift register circuit. When a column 112 is selected, the TFT switch s3 connects the respective column line 112 to the current source 142, thereby allowing the stimulus current to flow into the pixel site. When the column is deselected, the corresponding TFT switch is connected to ground (not shown) to ground the column line. In a similar fashion, row lines are activated by TFT switches 's1'. These switches are connected to ground when a row line is selected, allowing the current to flow out of the pixel site after it flows through the pixel 'ns' when the pixel site is forward biased by a potential on the column line. When a row is deselected, the corresponding TFT switch 's1' connects the row line to a high potential (not shown), reverse biasing the pixels connected to the deselected TOW.

Column and row decoders 150, 160 are provided for controlling switches s3, s4 and s1, s2, respectively, of column switching module 120 and row switching module 130. These decoders may also take the form of shift registers.

In this prior art sensor apparatus 100, the data signal that is present at each pixel (i.e., the differential voltage signal) is detected from the array 100 by a differential reading circuit (not shown) coupled to two high impedance nodes 144, 146 in block 140, which are connected to column lines 112 and row lines 114, respectively, through two large transistors 's4' and 's2,' respectively.

The heating effect is generated by transmitting a large electrical current (up to several milliamps) through a device in each sensing site. The voltage read across this device is a function of the temperature the device reaches when heated. If a foreign object is placed near this device, some of the heating power will flow away from it and its temperature will not reach its maximum level. This is reflected electrically by a difference in voltage across the device. The devices that form each sensing site in the array can be covered by a series of coatings that provide varied functions, such as physical protection, electrical protection, and thermal conduction.

Advances in lower cost semiconductor electronics, such as high performance polycrystalline silicon thin film transistors (TFT), have enabled the implementation of sensing arrays at a reduced cost. One of the main drawbacks of using lower cost technologies is, however, their limited device performance when compared to conventional, single crystal electronics. The thin films formed by the polycrystalline material used to fabricate these sensors can yield devices that generate high amounts of electrical noise, particularly when using a high current to obtain a high thermal signal. This makes the task of obtaining a good signal-to-noise ratio difficult.

In the prior art active sensing sites ns, a nonlinear device such as a diode is used inside each sensing site or pixel. By utilizing a non-linear device such as a diode, one can provide electrical isolation from other sensing sites when connected in an array fashion. This diode allows the heating current to flow when selected and provides isolation when the current is not present. However, when in presence of a large current these diodes generate higher than expected noise, which partially obscures the voltage signal response to the temperature changes. This effect is particularly troublesome when using materials such as polysilicon for the formation of the diode active region. Experimental results have shown that the noise performance of diodes fabricated with thin film polysilicon can degrade at higher currents. Depending on the current levels, the electrical noise can increase to the point where the sensor is useless.

In embodiments of the invention presented herein, the heating path for the thermal sensor site is split from that of the reading path. As a result of this split architecture, the large noise attributable to the heating current through the diode does not interfere with the measurement. This split architecture can be accomplished by adding extra vertical conducting traces as well as extra devices within the sensing array. A low current, low noise path is created for use in sensing the thermal signal. Fingerprint sensors using this topology exhibit higher signal-to-noise ratio and consequently are capable of accurately identifying prints under a variety of adverse conditions.

Figure 4:
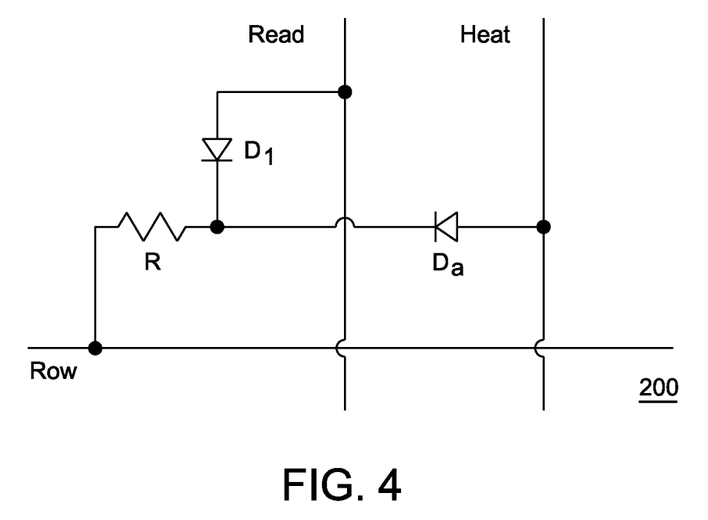
FIG. 4 is a circuit diagram of an active sensing site according to a first embodiment of the present invention.

FIG. 4 is an example of an embodiment of an active thermal sensor site 200 having an architecture with split heating and reading paths. In this embodiment, one extra access device (such as a diode D1) is added per sensing site and one extra vertical conducting trace is added per array column. In this configuration, a small current can be used during voltage measurement and would flow down the added vertical trace (labeled "Read") and through the added diode D1. This smaller sensing current that flows into the sensing site through the diode D1 would not cause as much noise as the heating current flowing through access diode Da.

As shown in FIG. 4, the sensing site includes a resistor R coupled to a row trace (labeled "Row") and to a column trace (labeled "Heat") through which a relatively large (e.g., about 1-5 mA) heating current is applied. The resistor R is coupled to this vertical heating trace through diode Da. The resistor is coupled to an additional, second vertical trace labeled "Read" for providing the relatively low (e.g., about 50 to a few hundred µA) sensing current. Resistor R is coupled to this vertical trace through diode D1. The diodes are preferably thin film diodes fabricated from a polysilicon base material. With this architecture, the diode Da that carries high current into the resistor R for activation is not in the low current readout path, which includes diode D1. The readout path carries only a small biasing current for diode D1, which should not generate much noise in the thin film polysilicon diode. In embodiments, the reading current is less than 250 µA, and more preferably less than 200 µA, and the heating current is at least 5, and preferably at least 10, and more preferably at least 50 times greater than the reading current.

As shown in FIG. 4, the active sensor site includes a pair of polysilicon access devices D1, Da. These devices can be generically referred to as non-linear devices, active semiconducting devices or selection devices. Though a diode is shown in FIG. 4, it is contemplated that other devices, such as thin film transistors, diode/capacitor hybrids such as metal-insulator-semiconductor (MIS) diode, or other devices could be employed assuming noise and fabrication requirements are met. In addition, although polysilicon is the preferred base material, other low cost base materials, such as but not limited to, zinc oxide may also be utilized.

Figure 5:
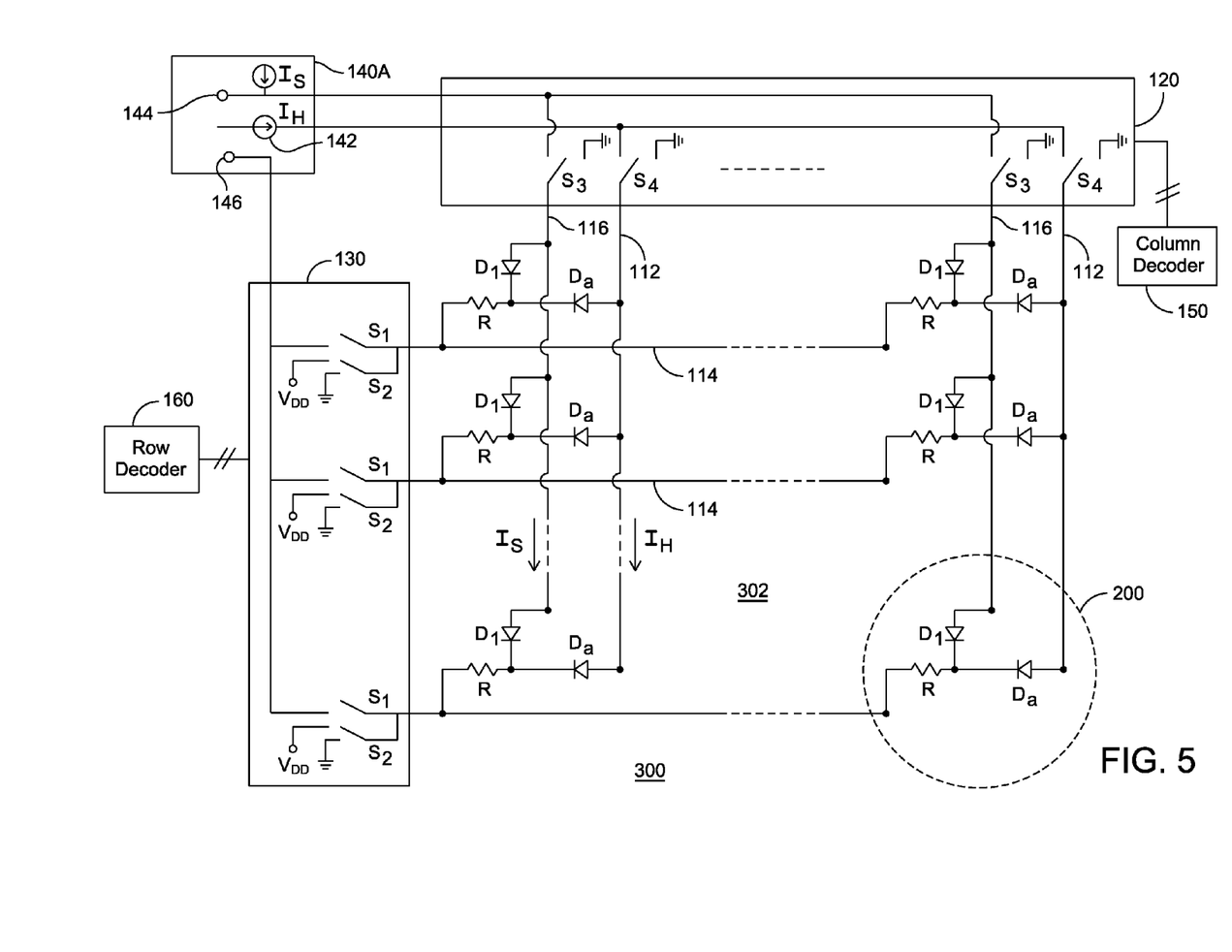
FIG. 5 is a diagram of a sensing apparatus including an array of the sensing sites illustrated in FIG. 4.

As with the sensor apparatus 100 discussed above in connection with FIG. 3 and shown in FIG. 5, the signal is read differentially by external circuits to the array at the end of each row and extra vertical conducting trace. FIG. 5 illustrates a sensing apparatus 300 having an array 302 of active sensing sites 200 arranged in rows and columns. The sensing apparatus also includes switching and selection circuitry such as column and row decoders 150, 160 and column and row switching modules 120, 130. Of particular note, each sensing site is connected to a column trace 112 (through which the high heating current $I_H$ flows) through its respective access diode Da and to a column trace 116 (through which low sensing current $I_S$ flows) through respective diode D1. A sensing current source for the modest sensing current for activating diodes D1 is shown in block 140A. The differential voltage is measured between high impedance nodes 144 and 146. As is clear from FIG. 5, this differential path does not include diode Da and thus the noise introduced when high activation current $I_H$ flows through this diode.

Figure 6:
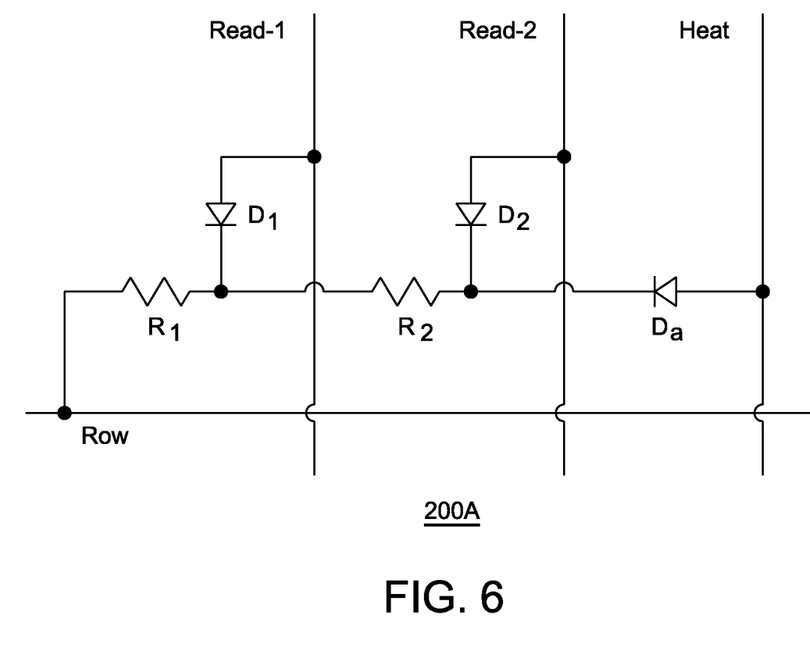
FIG. 6 is a circuit diagram of an alternative embodiment of an active sensing site according to the present invention.

While the architecture of FIG. 5 addresses the noise issues discussed above associated with active thermal sensors fabricated with thin film technology, the architecture adds one extra column trace 116 per column line of the array and one extra diode D1 per sensor site 200. FIG. 6 illustrates an alternative embodiment of a sensing architecture 200A where the high heating current flows through more than one sensing site at a time. In other words, individual sensing sites are connected serially. This architecture uses one extra diode per sensing site but, in contrast to the embodiment illustrated in FIG. 4, only one high current vertical conducting trace is needed per grouping of sensing sites.

With specific reference to FIG. 6, one heating line carries the current for two resistors (resistors R1 and R2). Each resistor is also coupled to its own readout line (Read-1 or Read-2, respectively) that includes an added access diode (D1 or D2, respectively) per resistor. Overall, only one extra column line is needed for the two sensing sites, providing significant space savings in the sensor array when compared to the apparatus illustrated in FIG. 4.

Figure 7:
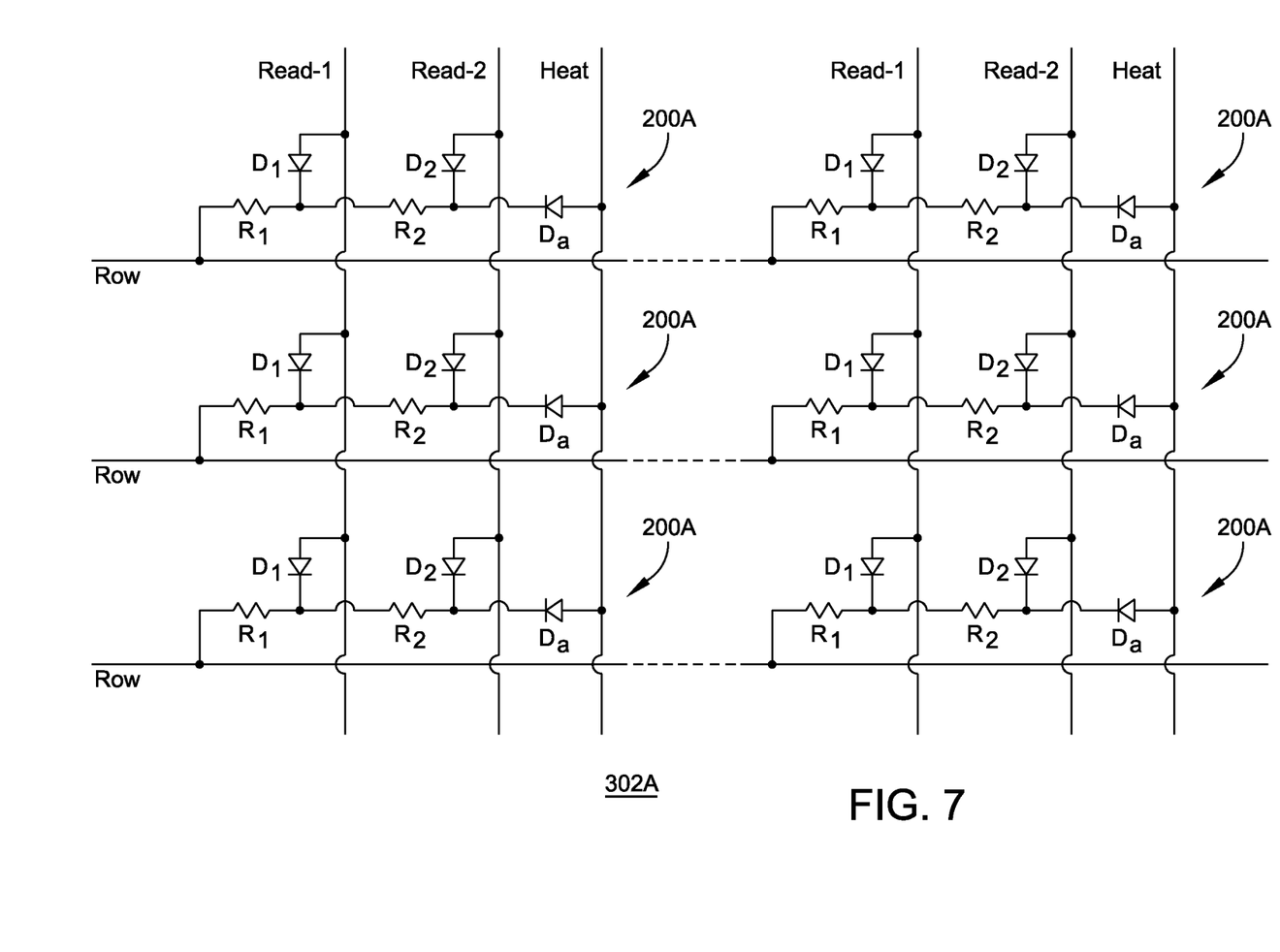
FIG. 7 is a circuit diagram of an array of the sensing sites illustrated in FIG. 6.

An array 302A using this architecture is illustrated in FIG. 7. It should be understood that the array 302A of FIG. 7 can be coupled to switch modules, decoder modules, biasing circuitry and sensing circuitry as discussed above in connection with FIG. 5 to form a sensor apparatus, modified of course to account for the different number of vertical column traces. The space savings facilitates the implementation of high resolution sensors arrays.

The number of sensing sites that can be connected serially is a function of factors such as heating power, resistance values and system operating voltages. By connecting two or more sensing sites serially their voltages are added together. On the other hand, by separating the heating path from the signal path, the noise generated by the heating current through the diodes is not relevant. This means that higher heating currents can be used without increasing noise levels at the signal paths. The heating current and resistor voltages can be modified in order to achieve the desired values of heating power without changing overall system voltage. This can be accomplished mainly because heating power is related to the product of heating current and resistor voltage. For example, in the embodiment shown in FIG. 6, by doubling the heating current and reducing in half the resistor voltage by reducing the resistor resistances from that of the embodiment of FIG. 4, the heating power at an individual site would remain the same as in the embodiment of FIG. 4 (i.e., $2 \cdot I_H A \times R/2\Omega = I_H \cdot RV$). Therefore, the two serially connected sensing sites would individually operate the same as that of a single site of FIG. 4 operating with normal heating current $I_H$.

The architecture of FIG. 6 is attractive not only from a space savings perspective but also because it is easily scaled. Larger heating currents can be used to supply multiple serially connected sites because noise from the access diode Da, which increases with current, is not in the reading path of the sites. However, there are limits on the number of serially connected sites due to excessive power consumption associated with increased heating current. Presently, two to three serially connected sensing sites are preferred but the actual number of sites can be optimized for the given application.

Figure 8A:
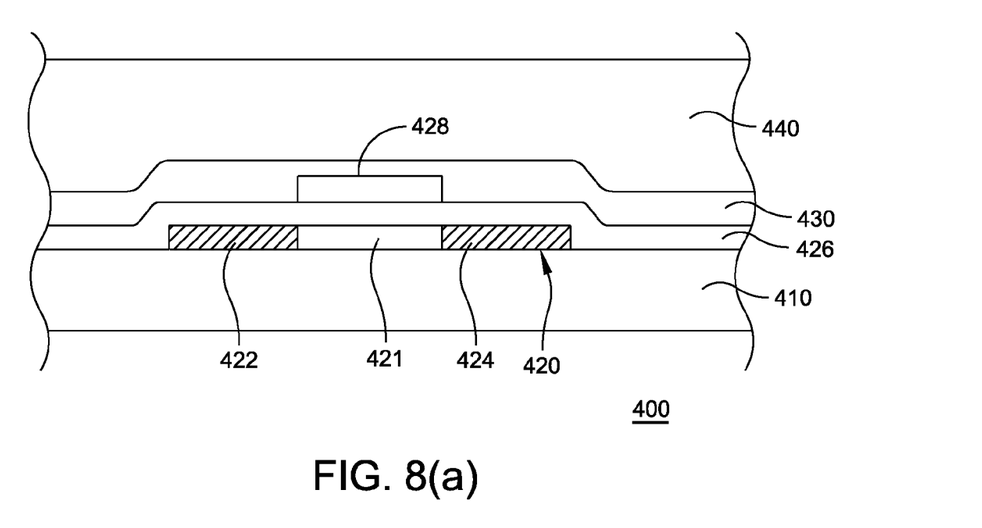
FIG. 8A is a sectional view of a polysilicon thin film transistor.

The sensor arrays discussed above can be integrated on the same substrate with other functional circuitry such as selection circuitry. For example, with reference to FIG. 5, the decoder modules 150, 160 and/or switching modules 120, 130 can be integrated with the arrays 302, 302A on a common substrate. Like the arrays 302 and 302A, these circuits use thin film devices such as TFTs and thin film diodes. By way of example only, FIG. 8A is a sectional view of a polysilicon TFT 400, such as disclosed in U.S. Pat. No. 7,229,860, which can be used as the polysilicon TFT switches shown in FIG. 5 or as transistors of other circuits integrated with the sensor arrays. As shown in FIG. 8A, a semiconductor layer 420 of polysilicon is formed on a substrate 410 formed from, for example, glass, quartz or polymer. The semiconductor layer 420 includes a channel region 421, a source region 422 and a drain region 424 opposite the source region 422 with respect to the channel region 421. The source and drain regions 422 and 424 are doped with n-type or p-type impurities and may include a silicide layer. A buffer insulating layer may be provided between the substrate 410 and the semiconductor layer 420 in this TFT.

A gate insulating film 426 of $SiO_2$ or $SiN_x$ is formed on the substrate 410 to cover the polysilicon semiconductor layer 420. A gate electrode 428 is formed over the gate insulating film 426 opposite the channel region 421. A gate line (not shown) is connected to the gate electrode 428 and may be provided over the gate insulating film 426.

An interlayer insulating film 430 is formed on the gate insulating film 426 to cover the gate electrode 428. The gate insulating film 426 and interlayer insulating film 430 have contact holes (not shown) exposing the source and drain regions 422 and 424 of the semiconductor layer 420 to accommodate source and drain electrodes (not shown). Data lines (not shown) connected to the source and drain electrodes may be further formed on the interlayer insulating film 430. A passivation film 440 made of $SiN_x$, $SiO_2$, SiOC, SiOF, or organic insulating material may be formed on the interlayer insulating film 430 to provide physical protection, electrical protection and/or thermal conduction.

Figure 8B:
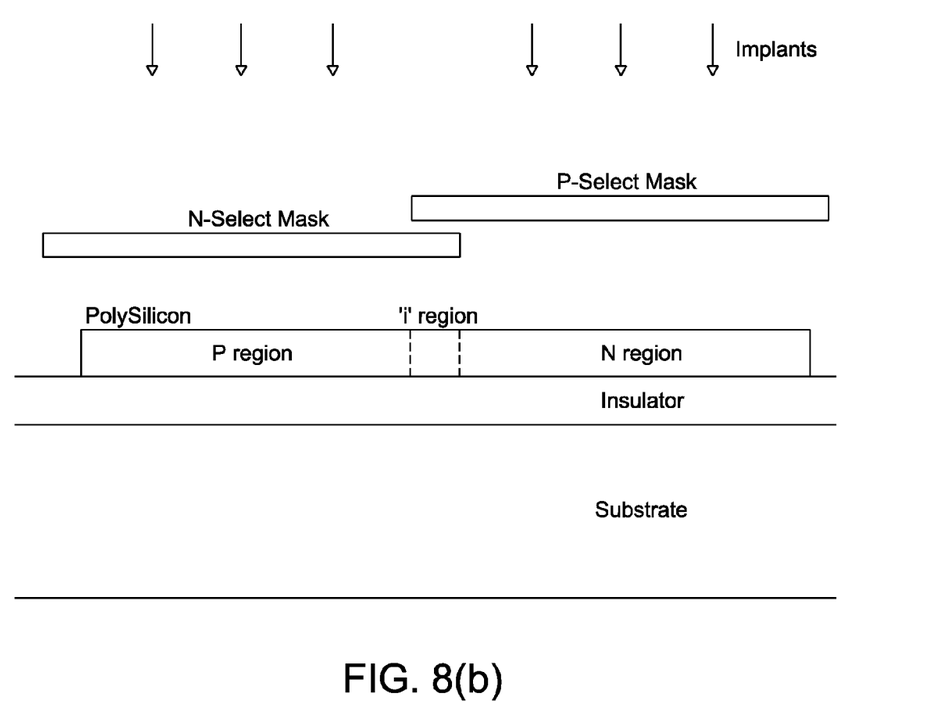
FIG. 8B is a sectional view illustrating the formation of a polysilicon thin film PIN diode.

By way of another example, FIG. 8(*b*) illustrates the formation of a thin film polysilicon PIN diode structure, which may be used for the thin film diodes within the arrays 302, 302A described above or in other circuits or devices integrated with the arrays. PIN diode structures may also be used for diodes D (FIGS. 6(*a*)/6(*b*)) in the non-linear sensing elements. This diode structure is formed over a substrate on a continuous polysilicon layer divided into three regions: a "p" doped region (labeled "P region"), an intrinsic (undoped) region (labeled "'i' region"), and an "n" doped region (labeled "N region"). PIN diodes provide good current drive and very low leakage current (i.e., no loss of signal). Furthermore, as FIG. 8(*b*) shows, they can be easily fabricated with CMOS polysilicon processing techniques. Implantation masks are shown in order to illustrate how a polysilicon material can be implanted to form the "p", "i" and "n" regions. For instance, and "n-select" implantation mask is used first to protect those areas that do not need "n" dopants. With this mask in place, "n" dopants are implanted into the unprotected portions of the polysilicon layer. In a second step, a "p-select" mask is used to protect those areas that do not need "p" dopants. With this mask in place, p-dopants are implanted into the unprotected portions of the polysilicon layer. By overlapping these two masks, an undoped intrinsic region is defined.

Figure 9:
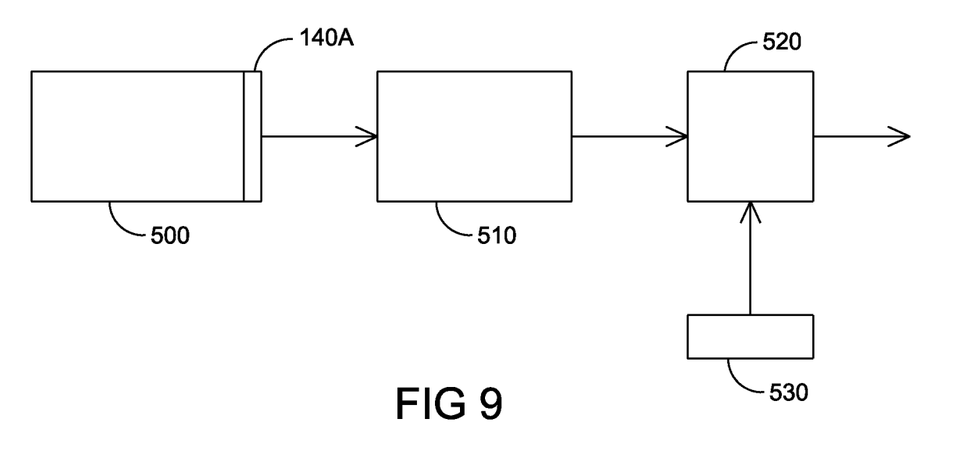
FIG. 9 shows in schematic block form a fingerprint recognition system incorporating the sensing device described herein.

FIG. 9 shows in schematic block form a fingerprint recognition system incorporating the sensing device, here represented by the block 500. The system includes means responsive to an output from the sensing circuit of the device to provide representative data of a sensed fingerprint, and means for comparing said representative data with stored representative data for one or more fingerprints. The output obtained from the sensing device is provided in a form comparable to the video output provided by an image sensor in known optical fingerprint sensing devices. Accordingly, and as will be apparent to skilled persons, components of the system, other than the sensing device, can be generally of the kind employed in systems using optical sensing devices. The representative data, in accordance with standard practice, may take the form of information regarding the orientation of ridge lines and relative positions of minutiae, that is the ending and bifurcations of the lines. The processing of information obtained from the sensing device to produce and compare representative data can follow known schemes and techniques. Because the sensing device of the invention is capable of providing information of the three dimensional profile of a fingerprint, improved accuracy of identification or verification can be obtained by making use of topological features in addition to the spatial positions of minutiae, although of course use may be made only of information in respect of the two-dimensional ridge patterns to simplify the processing necessary if less accuracy is acceptable.

Briefly, the output from the device 500, suitably conditioned, is fed to an analysis circuit 510 that is programmed to detect characterizing features of the fingerprint sensed such as the position of minutiae. Data from the circuit 510 is supplied to a computer 520 or other processor which through standard algorithms compares the data with representative data of a plurality of fingerprints, or a single fingerprint depending on whether the system is used for identification or merely verification purposes, held in a storage device 530 and which provides an output in accordance with whether or not a match has been found.

The circuit 510 can be programmed either to utilize the three dimensional information provided by the sensing device for high accuracy of recognition, or alternatively, with appropriate discrimination to select particular output signal values from the device 500, utilizing specific information representative of the two dimensional ridge pattern in the nature of a binary image similar to that obtained from known optical sensing devices.

In the sensor architecture presented here, the heating path is split from the reading path. This architecture isolates the large noise created by the heating current passing through a thin film access device from the sensor measurement. The split can be accomplished by adding extra vertical conducting traces as well as extra devices within the array. A low current, low noise path is created to sense the thermal signal. Fingerprint sensors using this topology would exhibit higher signal-to-noise ratio and consequently would be capable of accurately identifying prints under a variety of adverse conditions.

Although the invention has been described in terms of exemplary embodiments, it is not limited thereto. For example, while certain embodiments of this architecture have been described in connection with thermal sensor and/or fingerprint sensing arrays, the concepts described herein apply to non-thermal non-linear sensing technologies and applications beyond fingerprint sensing. The concepts described herein apply more generally to architectures where excessive noise in a reading path is a concern. As such, the appended claims should be construed broadly to include other variants and embodiments of the invention that may be made by those skilled in the art without departing from the scope and range of equivalents of the invention.

What is claimed is:

1. A sensor apparatus, comprising:
   an array of active sensor elements arranged in columns and rows,
   a plurality of thin film access devices, each sensor element being associated with a respective one of the plurality of thin film access devices,
   wherein the respective thin film access device associated with each sensor element is disposed in a first current path through which an activation current from an activation current source is provided to activate the sensor element, the thin film access device coupling the sensor element to the activation current from the activation current source when biased in an on condition,
   wherein each sensor element is read through a respective second current path,
   wherein the second current paths do not include the thin film access device of the first current path, whereby noise from the thin film access device is isolated from the second current paths,
   wherein each of the second current paths includes a respective thin film access device through which a reading current is provided when accessing the sensor elements for reading, and wherein a first end of each sensor element from a row of sensors elements is electrically coupled to a row line and a second end of each sensor element from the row of sensor elements is electrically coupled to a first column line through its respective thin film access device through which the activation current is provided and to a second column line through which a reading current is provided to its respective thin film access device of the second current path.

2. The sensor apparatus of claim 1, wherein each sensor element comprises a resistor and the thin film access device of the first current path is a diode.

3. The sensor apparatus of claim 1, wherein the activation current is greater than the reading current.

4. The sensor apparatus of claim 3, wherein the activation current is greater than the reading current by at least a factor of 100.

5. The sensor apparatus of claim 3, wherein the thin film access devices of the second current paths are diodes.

6. The sensor apparatus of claim 1, wherein the thin film access devices of the first and second current paths are non-linear devices.

7. The sensor apparatus of claim 1, wherein the thin film access devices of the first and second current paths are formed from a polysilicon base material.

8. An active thermal sensor apparatus, comprising:
an array of sensor elements arranged in columns and rows, the array includes a plurality of thin film access diodes and a plurality of thin film reading diodes, each sensor element comprising a resistor for providing heat to a sensing site, each sensor element being associated with a respective thin film access diode for providing an activation current to the resistor when forward biased and associated with a respective thin film reading diode for establishing a current path for reading the resistor when forward biased, wherein a first end of each resistor in a row of sensor elements is electrically coupled to a row line and a second end of each resistor in the row of sensor elements is electrically coupled to a first column line through its respective thin film access diode through which the activation current is provided and to a second column line through which a reading current is provided to its respective thin film reading diode, and
wherein the activation current is greater than the reading current.

9. The sensor apparatus of claim 8, wherein the reading current is less than 250 µA and the activation current is greater than the reading current by at least a factor of 5.

10. The sensor apparatus of claim 8, wherein the thin film access diode and the thin film reading diode are formed from a polysilicon base material.

11. An apparatus for measuring a pattern in a surface of an object, comprising:
an array of sensor elements arranged in columns and rows, each sensor element being responsive to a physical parameter of the object surface,
wherein each sensor element is associated with a respective first non-linear thin film access device disposed in a first current path through which an activation current is provided to activate the sensor element,
wherein each sensor element is read through a respective second current path including a second non-linear thin film access device through which a reading current is provided when accessing the sensor element for reading,
wherein the activation current is greater than a reading current,
wherein the second current paths do not include the first non-linear thin film access device of the first current path, whereby noise from the first non-linear thin film access device is isolated from the second current paths, and
wherein a first end of each sensor element from a row of sensors elements is electrically coupled to a row line and a second end of each sensor element from the row of sensor elements is electrically coupled to a first column line through its respective first non-linear thin film access device through which the activation current is provided and to a second column line through which the reading current is provided to its respective second non-linear thin film access device;
a first current source for providing the activation current; and
a second current source for providing the reading current.

12. The apparatus of claim 11, further comprising selection circuitry for selectively accessing the sensor elements to obtain a differential signal representative of the physical parameter from the sensor elements, and selection circuitry for selectively connecting the sensor elements to the first current source to activate the sensor elements.

13. The apparatus of claim 11, wherein each of the sensor elements includes a resistor.

14. The apparatus of claim 13, wherein heat activation of the sensor elements is provided for by the first current source, and temperature sensing is performed on the basis of a voltage change caused by the heat activation.

15. The apparatus of claim 11 wherein the first and second non-linear thin film access devices of the first and second current paths are diodes.

16. The apparatus of claim 15 wherein the reading current is less than 250 µA and the activation current is greater than the reading current by at least a factor of 5.

17. The apparatus of claim 1, further comprising first addressable column and row selection circuitry connected to the activation current source and the plurality of access devices of the first current paths, the selection circuitry configured for selectively connecting the sensor elements to the activation current source, wherein the respective thin film access device associated with a sensor element is biased in the on condition when row and column combination associated with the sensor element is selected through the selection circuitry.

18. The apparatus of claim 17, further comprising second addressable column and row selection circuitry for selectively connecting each sensor element to its respective second current path when the row and column combination associated with the sensor element is selected through the second addressable column and row selection circuitry.

19. The apparatus of claim 8, further comprising first addressable column and row selection circuitry connected to an activation current source and the plurality of thin film access diodes, the selection circuitry configured for selectively connecting the sensor elements to the activation current source, wherein the respective thin film access diode associated with a sensor element is forward biased when the row line and the first column line to which the sensor element is connected are selected through the selection circuitry.

20. The apparatus of claim 19, further comprising second addressable column and row selection circuitry for selectively connecting each sensor element to its respective reading current path when the row line and second column line to which the sensor element is connected is selected through the second addressable column and row selection circuitry.

21. The apparatus of claim 20, wherein the respective thin film reading diode associated with the sensor element is forward biased when the row line and second column line to which the sensor element is connected are selected through the second addressable column and row selection circuitry.

* * * * *